United States Patent
Park et al.

(10) Patent No.: US 9,728,681 B2
(45) Date of Patent: Aug. 8, 2017

(54) ORGANIC ELECTROLUMINESCENCE DEVICE AND FABRICATION METHOD THEREOF

(71) Applicant: LG Display Co., Ltd., Seoul (KR)

(72) Inventors: Se Hee Park, Seoul (KR); Dae Hwan Kim, Paju-si (KR); Saurabh Saxena, Paju-si (KR); Pil Sang Yun, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 185 days.

(21) Appl. No.: 14/308,529

(22) Filed: Jun. 18, 2014

(65) Prior Publication Data

US 2015/0349040 A1 Dec. 3, 2015

(30) Foreign Application Priority Data

Jun. 21, 2013 (KR) .................. 10-2013-0071865

(51) Int. Cl.
| | |
|---|---|
| *H01L 33/44* | (2010.01) |
| *H01L 29/786* | (2006.01) |
| *H01L 29/24* | (2006.01) |
| *H01L 27/32* | (2006.01) |
| *H01L 33/40* | (2010.01) |
| *H01L 27/12* | (2006.01) |

(52) U.S. Cl.
CPC ......... *H01L 33/44* (2013.01); *H01L 27/1225* (2013.01); *H01L 27/322* (2013.01); *H01L 27/3248* (2013.01); *H01L 27/3272* (2013.01); *H01L 29/24* (2013.01); *H01L 29/7869* (2013.01); *H01L 29/78633* (2013.01); *H01L 29/78684* (2013.01); *H01L 33/40* (2013.01); *H01L 2227/323* (2013.01)

(58) Field of Classification Search
CPC ................................ H01L 33/40; H01L 33/44
See application file for complete search history.

(56) References Cited

U.S. PATENT DOCUMENTS 6,777,716 B1 * 8/2004 Yamazaki ........... H01L 27/1214
257/88
2001/0040645 A1 * 11/2001 Yamazaki ......... G02F 1/133305
349/42

(Continued)

FOREIGN PATENT DOCUMENTS

CN 1779990 A 5/2006

OTHER PUBLICATIONS

European Patent Office, Search Report, European Patent Application No. 14172653.9, Nov. 20, 2014, seven pages.

(Continued)

*Primary Examiner* — Joseph C Nicely
(74) *Attorney, Agent, or Firm* — Fenwick & West LLP

(57) ABSTRACT

An organic electroluminescence device is disclosed which includes: a substrate; a thin film transistor formed on the substrate; a first electrode formed on the substrate provided with the thin film transistor; an organic light emission layer and a second electrode sequentially formed on the first electrode; and a first light absorption layer formed over the thin film transistor and configured to shield light emitted from the organic light emission layer. As such, the organic electroluminescence device employing the oxide thin film transistor can secure reliability against light.

16 Claims, 15 Drawing Sheets

(56) References Cited

U.S. PATENT DOCUMENTS

| | | | |
|---|---|---|---|
| 2002/0038998 A1* | 4/2002 | Fujita | G09G 3/3233 313/495 |
| 2005/0269942 A1 | 12/2005 | Ahn et al. | |
| 2007/0090365 A1 | 4/2007 | Hayashi et al. | |
| 2008/0024479 A1 | 1/2008 | Jung et al. | |
| 2008/0057718 A1* | 3/2008 | Omata | B23K 26/0676 438/694 |
| 2012/0074388 A1 | 3/2012 | Park et al. | |

OTHER PUBLICATIONS

Chinese Office Action, Chinese Application No. 201410273127.0, Aug. 2, 2016, 10 pages (with concise explanation of relevance).

* cited by examiner

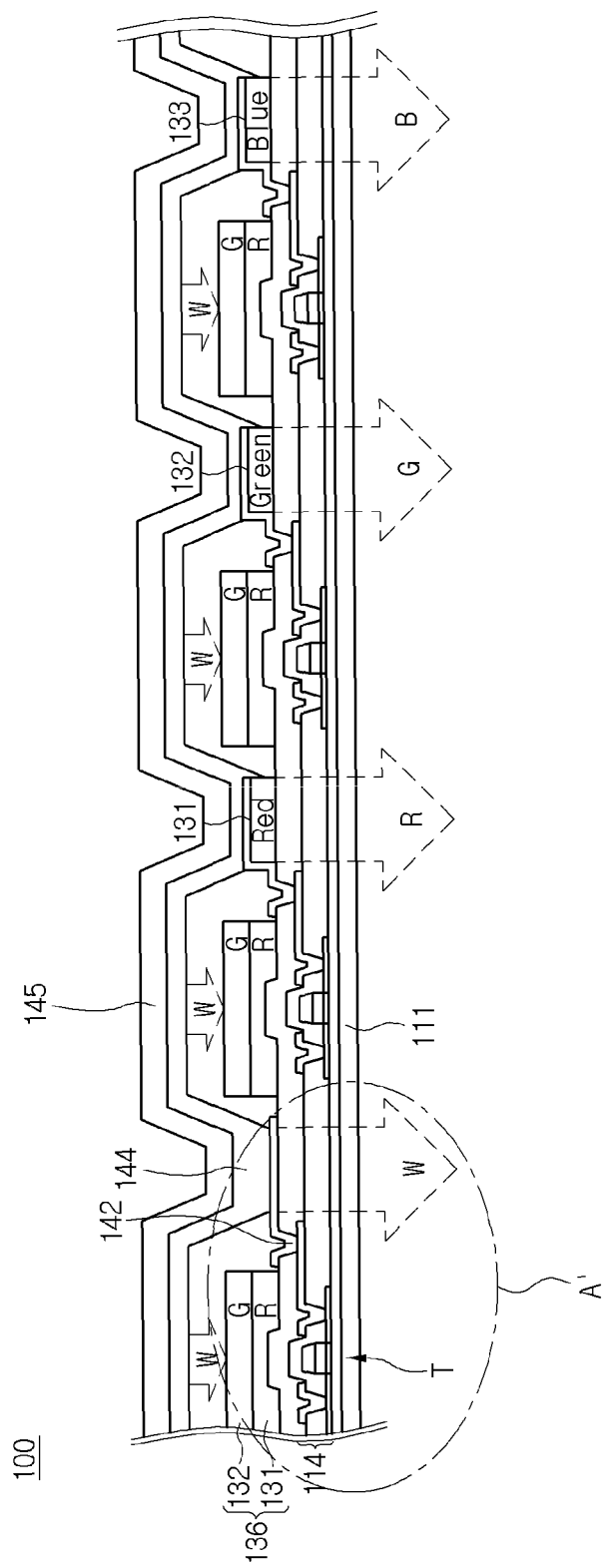

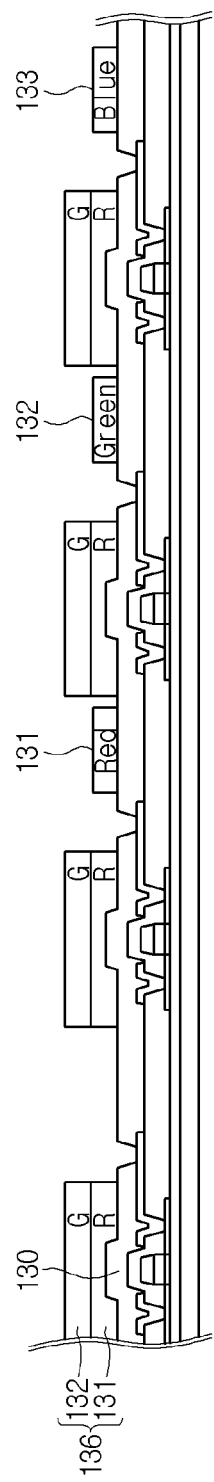

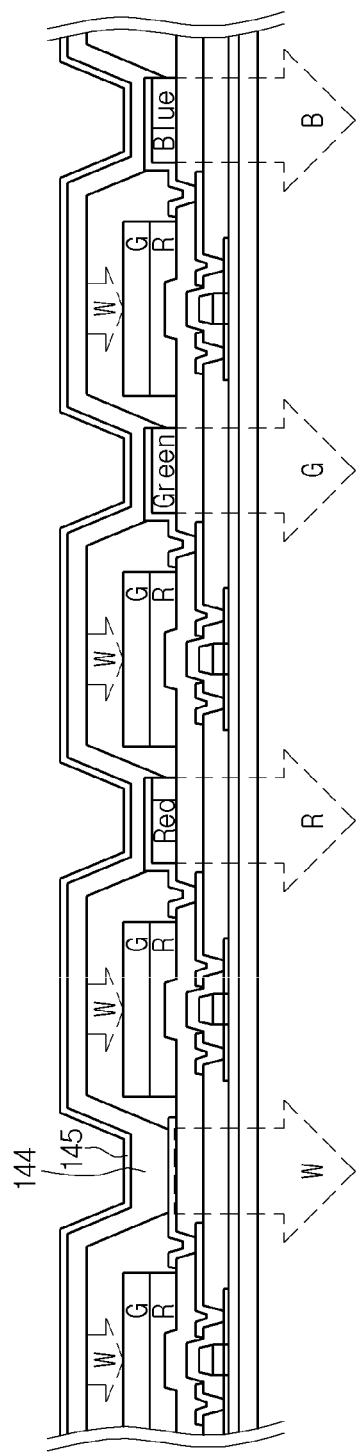

ORGANIC ELECTROLUMINESCENCE DEVICE AND FABRICATION METHOD THEREOF

The present application claims priority under 35 U.S.C. §119(a) of Korean Patent Application No. 10-2013-0071865 filed on Jun. 21, 2013 which is hereby incorporated by reference in its entirety.

BACKGROUND

1. Field of the Disclosure

The present application relates to an organic electroluminescence device. More particularly, the present application relates to an organic electroluminescence device adapted to secure reliability against light, and to a fabrication method thereof.

2. Description of the Related Art

An organic electroluminescence device is called as an organic light emitting display (OLED) device. The organic electroluminescence device emits light by forming excitons through re-combination of electrons and electric-holes, which are injected from an electron injection electrode and an electric-hole injection electrode into an organic light emission layer, and transitioning the excitons from an excited state to a ground state.

As such, the organic electroluminescence device has a self-luminous property. In other words, the organic electroluminescence device does not require any separated light source, unlike a liquid crystal display device. In accordance therewith, the organic electroluminescence device can reduce thickness and weight. Also, the organic electroluminescence device has superior features of low power consumption, high brightness, high-speed response and so on. Therefore, the organic electroluminescence device attracts public attention as a next generation display device of a mobile appliance. Moreover, a procedure of fabricating the organic electroluminescence device is simple. As such, fabricating cost of the organic electroluminescence device is reduced larger than that of the existing liquid crystal display device.

In order to realize a variety of colors, a color filter mode using white light and color filters, a color changing mode using blue light and a color change medium, a three color independent pixel mode using red, green and blue organic light emission materials and so on are being applied to the organic electroluminescence devices. The organic electroluminescence device using white light and color filters is called as a white OLED device.

The organic electroluminescence device allows light generated in the organic light emission layer to be emitted toward an electrode with a high transmittance among first and second electrodes. Such organic electroluminescence devices are classified into a top emission mode and a bottom emission mode.

FIG. 1A is a cross-sectional view showing an organic electroluminescence device of the related art. In detail, FIG. 1A is a cross-sectional view showing a white OLED device of a bottom emission mode according to the related art. FIG. 1B is an enlarged view largely showing a region A in FIG. 1A.

Referring to FIG. 1A, the organic electroluminescence device 10 of the related art includes a first substrate 11 provided with a thin film transistor array 14 and an organic light emission layer 44, and a second substrate (not shown) facing the first substrate 11. The organic electroluminescence device 10 is completed by combining the first substrate 11 and the second substrate (not shown) using a sealant.

In detail, the organic electroluminescence device includes the thin film transistor array 14 formed on the first substrate 11, a first electrode 42 independently patterned on the thin film transistor array 14 into pixels, the organic light emission layer 44 formed on the first electrode 42, and a second electrode 45 formed on the entire surface of the organic light emission layer 44. The thin film transistor array 14 is configured with a plurality of thin film transistors which includes a driving thin film transistor T and is formed on the first substrate 11. The driving thin film transistor T included in the thin film transistor array can become any one of an edge stopper structure and a coplanar structure.

The driving thin film transistor T can be formed in the coplanar structure as shown in FIG. 1B. The driving thin film transistor T of the coplanar structure includes: a buffer layer 12 formed on the entire surface of the substrate 11; a semiconductor layer 20 formed on the buffer layer 12; a gate insulation film 21 and a gate electrode sequentially formed on the central region of the semiconductor layer 20; a first insulation layer 23 formed on the entire surface of the substrate 11 provided with the gate insulation 21 and the gate electrode 22; source and drain electrodes 24a and 24b formed on the first insulation layer 23; and so on.

The semiconductor layer 20 is defined into an active domain 20' and source/drain domains 20a and 20b which are formed in both sides of the active domain 20'. The source and drain electrodes 24a and 24b are connected to the source and drain domains 20a and 20b of the semiconductor layer 20, respectively.

A second insulation layer 30 is formed on the entire surface of the substrate 11 provided with the source and drain electrodes 24a and 24b. The first electrode 42, the organic light emission layer 44 and so on are sequentially formed on the second insulation layer 30.

Referring to FIGS. 1A and 1B, if the organic electroluminescence device is a white OLED device, the organic light emission layer 44 emits white light. In this case, red, green and blue color filters 31, 32 and 33 are formed between the second insulation layer 30 and the first electrode 42 in red, green and blue pixel regions. However, any color filter is not formed in a white pixel region.

If the organic electroluminescence device 10 is formed in the bottom emission mode, light emitted from the organic light emission layer 44 is radiated to the exterior through the first substrate 11. In this case, the second electrode 45 also performs a function of a reflective plate. The bottom emission mode forces the plurality of thin film transistors including the driving thin film transistor T to be easily exposed to light which is emitted from the organic light emission layer 44. More particularly, the white OLED device including the organic light emission layer formed on the entire surface of the substrate 11 forces the exposure of the thin film transistors to increase.

Meanwhile, IGZO (indium gallium zinc oxide) recently attracts public attention as a material of the semiconductor layer 20 of the thin film transistor. This results from the fact that IGZO has transparency and superior conductivity and is possible to use a low temperature process of below 300° C. However, IGZO enables atoms to exist at deep states near an electron band. Due to this, IGZO must be materially sensitive to light.

Moreover, IGZO with a high mobility is more sensitive to light because of having a narrow band gap. Actually, properties of IGZO are easy to deteriorate by light included in green and blue wavelength bands and by feeble light of about 500 cd/m2.

Due to this, when IGZO is used in the organic electroluminescence device and more particularly in the white OLED device as a semiconductor material, reliability of the thin film transistor against light must largely deteriorate.

BRIEF SUMMARY

Accordingly, embodiments of the present application are directed to an organic electroluminescence device and a fabrication method thereof that substantially obviate one or more of problems due to the limitations and disadvantages of the related art.

The embodiments are to provide an organic electroluminescence device which is adapted to secure reliability against light by preventing deterioration of a thin film transistor due to light emitted from an organic light emission layer, and a fabrication method thereof.

Also, the embodiments are to provide an organic electroluminescence device which is adapted to secure reliability against light by preventing deterioration of a thin film transistor due to external light, and a fabrication method thereof.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a general aspect of the present embodiment for solving the above-mentioned problems, an organic electroluminescence device includes: a thin film transistor; a first electrode connected to the thin film transistor; an organic light emission layer formed on the first electrode; a second electrode formed on the organic light emission layer; and a first light absorption layer formed over the thin film transistor between the thin film transistor and the organic light emission layer. The first light absorption layer is configured to shield light emitted from the organic light emission layer.

Also, the organic electroluminescence device may further include a second light absorption layer formed under the thin film transistor.

In another embodiment, an organic electroluminescence device comprises a transistor array including a plurality of thin film transistors; an organic light emitting diode array including a plurality of organic light emitting diodes, each organic light emitting diode of the organic light emitting diode array coupled to a corresponding thin film transistor of the transistor array; and a first light absorption layer disposed over the plurality of thin film transistors and between the transistor array and the organic light emitting diode array.

An organic luminescence device fabrication method according to another general aspect of the present embodiment for solving the above-mentioned problems includes: forming a thin film transistor on a substrate; forming an insulation layer on the substrate provided with the thin film transistor; forming a first light absorption layer over the thin film transistor; forming a first electrode on the insulation layer; and forming the organic light emission layer over the first light absorption layer and the first electrode; and forming a second electrode on the organic light emission layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings:

FIG. 2A is a cross-sectional view showing an organic electroluminescence device according to an embodiment of the present disclosure;

FIGS. 7A through 7F are cross-sectional views illustrating a method of fabricating an organic electroluminescence device according to an embodiment of the present disclosure.

DETAILED DESCRIPTION OF THE EMBODIMENTS

Figure 1A:
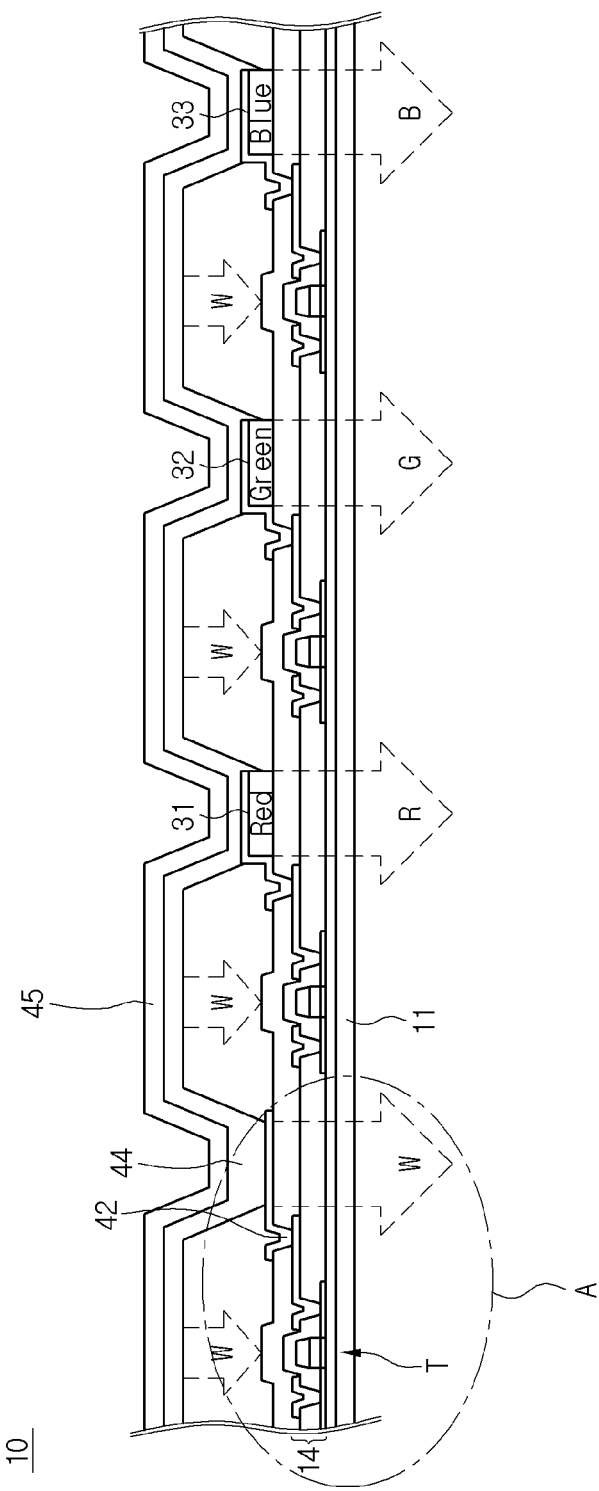
FIG. 1A is a cross-sectional view showing an organic electroluminescence device of the related art.
Figure 1B:
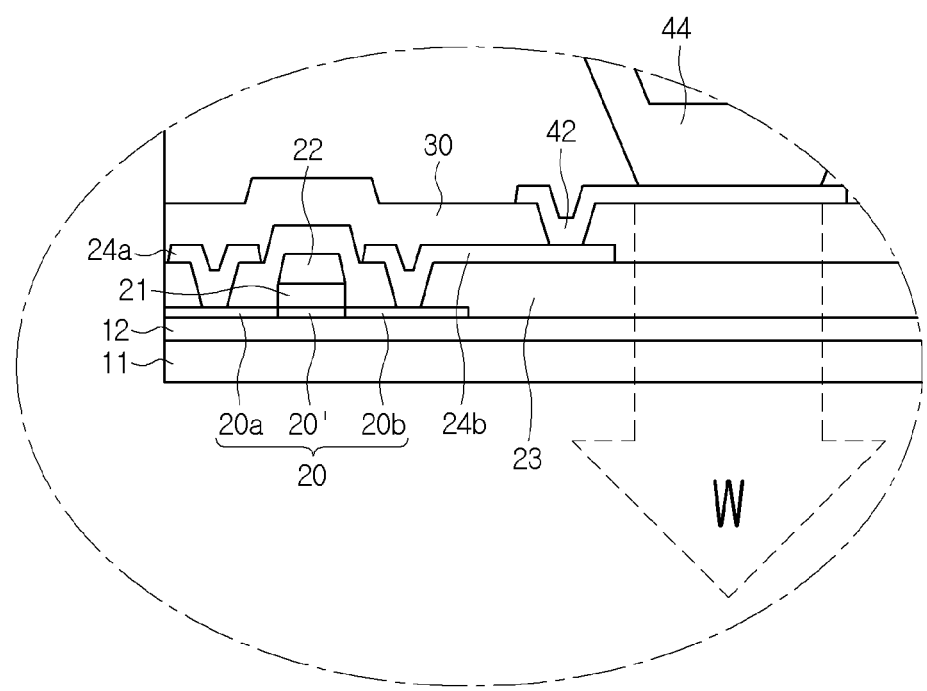
FIG. 1B is an enlarged view largely showing a region A in FIG. 1A.

Reference will now be made in detail to an organic electroluminescence device and a fabrication method thereof in accordance with embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 2B:
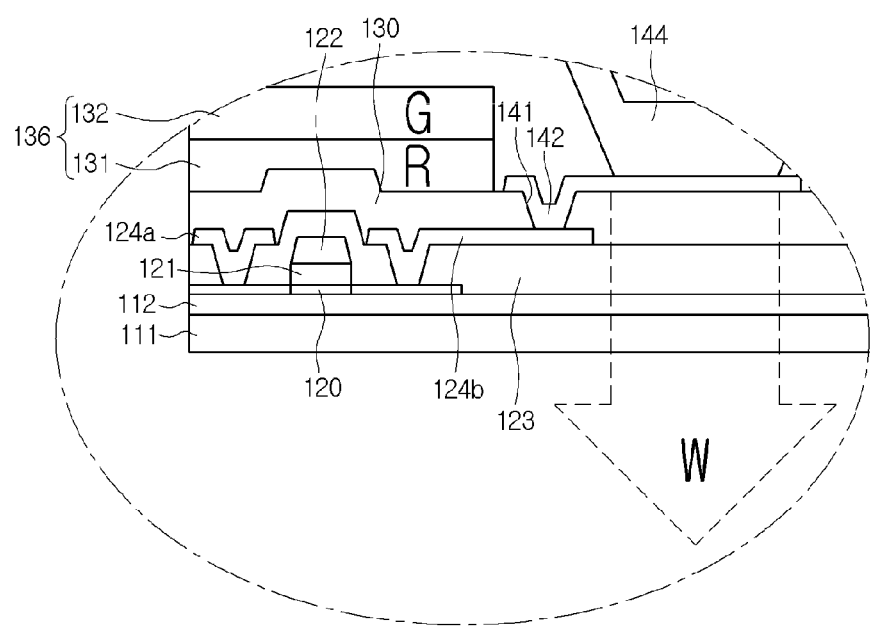
FIG. 2B is an enlarged view largely showing a region A in FIG. 2A.

FIG. 2A is a cross-sectional view showing an organic electroluminescence device according to an embodiment of the present disclosure. In detail, FIG. 2A is a cross-sectional view showing a white OLED device of a bottom emission mode according to an embodiment of the present disclosure. FIG. 2B is an enlarged view largely showing a region A in FIG. 2A.

Referring to FIG. 2A, the organic electroluminescence device 100 according to an embodiment of the present disclosure is configured with a first substrate 111 and a second substrate (not shown). The first substrate 111 and the second substrate are separated from each other in such a manner as to face each other.

The organic electroluminescence device 100 includes a thin film transistor array 114 formed on the first substrate 111, and a first electrodes 142 independently formed on the thin film transistor array 114 in every pixel. Also, the organic electroluminescence device 100 includes an organic light emission layer 144 formed on the first electrode 142, and a second electrode 145 formed on the entire surface of the organic light emission layer 144.

The thin film transistor array 114 includes a driving thin film transistor T which can be formed in any one of an edge stopper structure and a coplanar structure. If the driving thin film transistor T is formed in the edge stopper structure, a bottom gate thin film transistor can be applied to the driving thin film transistor T. Moreover, an etch stopper for etch prevention can be formed on a channel layer opposite to the gate electrode. Meanwhile, the driving thin film transistor T of the coplanar structure allows a gate electrode and source and drain electrodes to be all formed on one surface of an active layer. Also, an inverted coplanar structure corresponding to a bottom gate structure can be applied to the driving thin film transistor T.

As shown in FIG. 2B, the driving thin film transistor T can be formed in the coplanar structure. Referring to FIG. 2B, the driving thin film transistor T is completed by depositing a buffer layer 112 on the substrate 111 and sequentially forming a semiconductor layer 120, a gate insulation film 121, a gate electrode 122, a first insulation layer 123 and source and drain electrodes 124a and 124b. A second insulation layer 130, a first electrode 142, an organic light emission layer 144 and so on are sequentially formed on the substrate 111 provided with the source and drain electrodes 124a and 124b of the driving thin film transistor T.

Referring to FIGS. 2A and 2B, electrons injected from the second electrode 145 and electric-holes injected from the first electrode 142 are drifted toward the organic light emission layer 144 when a voltage is applied between the first electrode 142 and the second electrode 145. As such, the electrons and the electric-holes applied into the organic light emission layer 144 collide and are recombined with each other within the organic light emission layer 144, thereby generating light. In this case, the first electrode 142 is used as an anode and the second electrode 145 is used as a cathode.

If the organic electroluminescence device 100 is a white OLED device, the organic light emission layer 144 emits white light. As such, red, green and blue color filters 131, 132 and 133 are formed between the second insulation layer 130 and the first electrode 142 in red, green and blue pixel regions, respectively. Meanwhile, no color filter is formed in a white pixel region. In accordance therewith, the white pixel region allows white light W generated in the organic light emission layer to be output.

Alternatively, if the organic electroluminescence device is fabricated in the bottom emission mode, light emitted from the organic light emission layer 144 is radiated to the exterior through the first electrode 142 and the first substrate 111. In this case, the second electrode also performs a function of a reflective plate.

The first electrode 142 can be formed from a transparent conductive material such as ITO (indium-tin-oxide), IZO (indium-zinc-oxide) or others. The second electrode 145 can be formed from an opaque metal material with a reflective property. For example, the second electrode 145 can be formed from one selected from a metal group which includes aluminum Al, gallium Ga, calcium Ca, magnesium Mg and so on.

The semiconductor layer 120 can be formed from an oxide semiconductor material such as IGZO. Preferably, the semiconductor layer 120 is formed from an oxide semiconductor material with mobility of at least 30 cm2/Vs. The oxide semiconductor material can be represented in the following chemical formula 1.

$$A_wB_xC_yO_z$$ <span style="float:right">[Chemical formula 1]</span>

In the chemical formula 1, "A", "B" and "C" are one of indium In, gallium Ga, zinc Zn, aluminum Al and tin Sn, respectively. Also, "w", "x", "y" and "z" are natural numbers of not less than 1 but no more than 10.

However, an oxide semiconductor layer with a high mobility is sensitive to light. To address this matter, the organic electroluminescence device 100 according to an embodiment of the present disclosure includes a light absorption layer 136 which is formed over the thin film transistor and used to shield light emitted from the organic light emission layer 144.

Preferably, the light absorption layer 136 is formed from a material selectively absorbing wavelength light which can affect deterioration of the semiconductor layer 120. As such, the concentration of heat for the light absorption layer 136 can be prevented. The wavelength of light affecting the light deterioration of the semiconductor layer 120 can be obtained from an optical band gap characteristic of the semiconductor layer 120.

Figure 3:
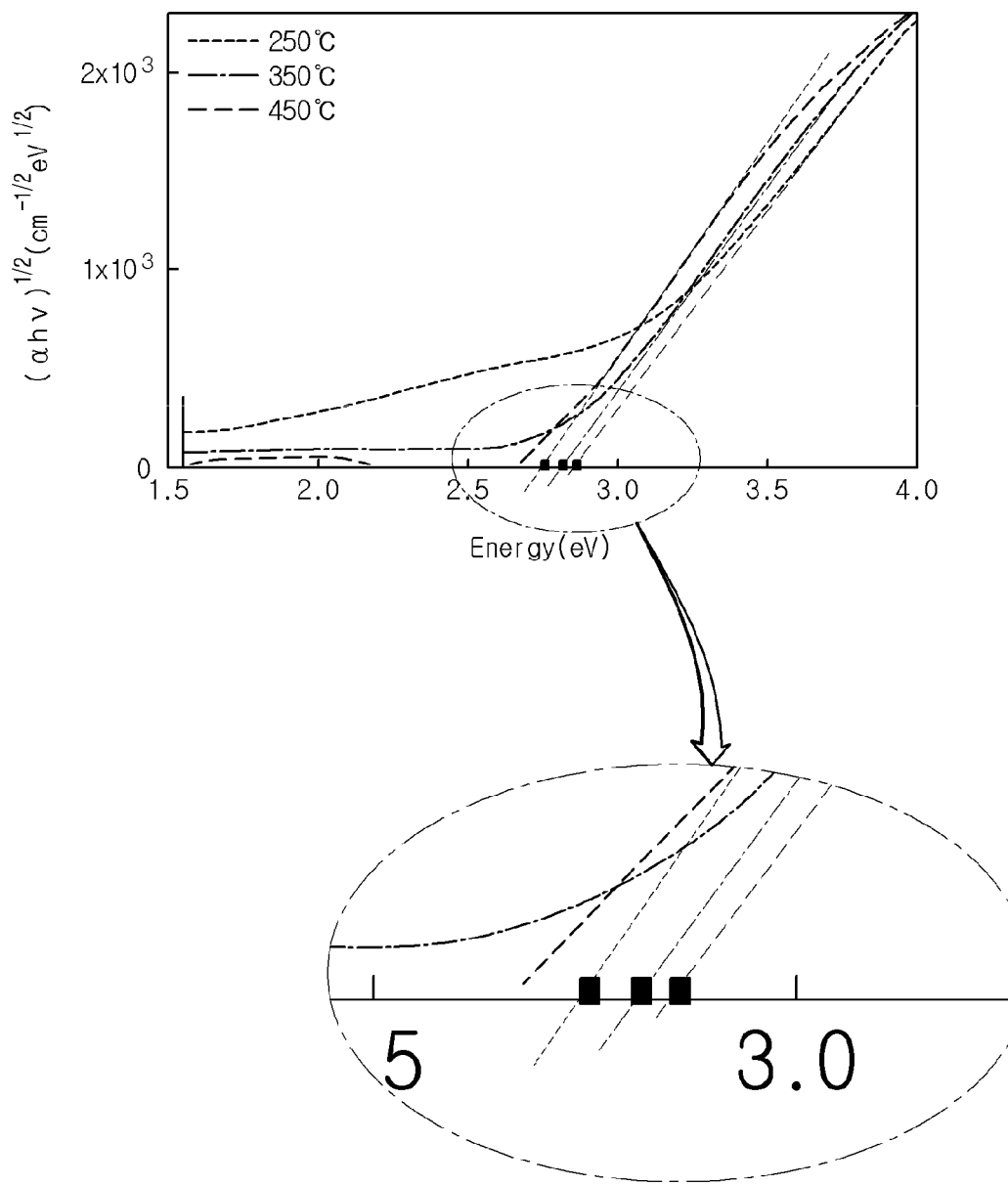
FIG. 3 is a data sheet illustrating an optical band gap characteristic of a semiconductor layer of organic electroluminescence device according to an embodiment of the present disclosure.

FIG. 3 is a data sheet illustrating an optical band gap characteristic of a semiconductor layer of an organic electroluminescence device according to an embodiment of the present disclosure. In detail, FIG. 3 illustrates the optical band gap characteristic of the semiconductor layer which has a mobility of not less than 30 cm2/Vs and is formed from IGZO with a fixed composition ratio.

Referring to FIG. 3, optical band gap energy of the IGZO semiconductor layer with the mobility of at least 30 cm2/Vs and a fixed composition ratio becomes a range of about 2.75~2.8 eV. The optical band gap energy of about 2.75~2.8 eV corresponds to energy of light with a wavelength range of 433 nm~450 nm. As such, when light with wavelengths of no more than 450 nm is irradiated, the IGZO semiconductor layer is deteriorated by light.

In view of this point, the light absorption layer 136 shown in FIG. 3 is designed to absorb larger energies than 2.8 eV, i.e. shorter wavelength light than 450 nm. As such, the light absorption layer 136 shown in FIG. 3 can be formed from a material with smaller band gap energy than 2.8 eV. For example, the light absorption layer 136 can be formed from one non-conductive inorganic material of silicon Si (1.1 eV), germanium Ge (0.67 eV), copper oxide CuO (1.2 eV), gallium arsenide GaAs (1.43 eV) and so on. Alternatively, the light absorption layer 136 can be formed to have a double layer structure of red and green color filters which are formed from organic materials.

Such a light absorption layer 136 formed from one of the organic and inorganic materials is preferably disposed over the thin film transistor as shown in FIGS. 2A and 2B, in order to shield light emitted from the organic light emission layer 144. Alternatively, the light absorption layer 136 can be disposed under the thin film transistor, in order to shield external light.

If the light absorption layer 136 is disposed under the thin film transistor, the light absorption layer 136 is preferably formed between the substrate 111 and the buffer layer 112. In this case, the light absorption layer 136 is preferably formed from a non-conductive inorganic material such as silicon Si (1.1 eV), germanium Ge (0.67 eV), copper oxide CuO (1.2 eV), gallium arsenide GaAs (1.43 eV) and so on.

When the light absorption layer 136 is formed in the double layer structure of the red and green color filters 131 and 132, the light absorption layer 136 is preferably formed in the same layer as red, green and blue color filters which are formed in red, green and blue pixel regions.

Figure 4A:
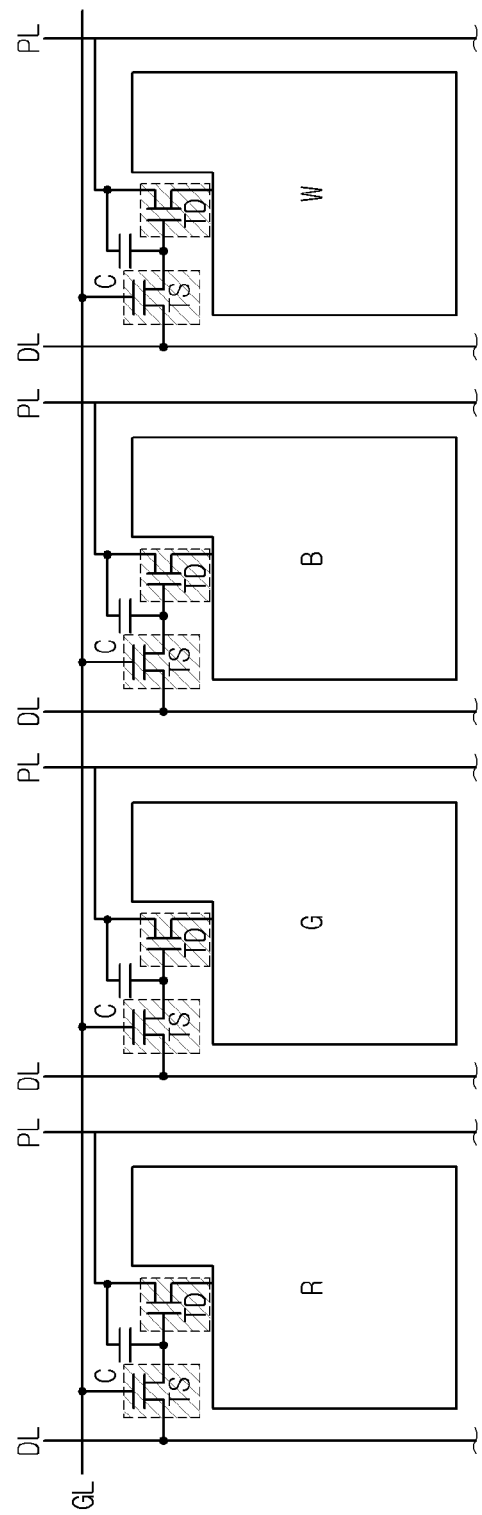
FIGS. 4A and 4B are planar views showing a formation region of a light absorption layer of an organic electroluminescence device according to an embodiment of the present disclosure.
Figure 4B:
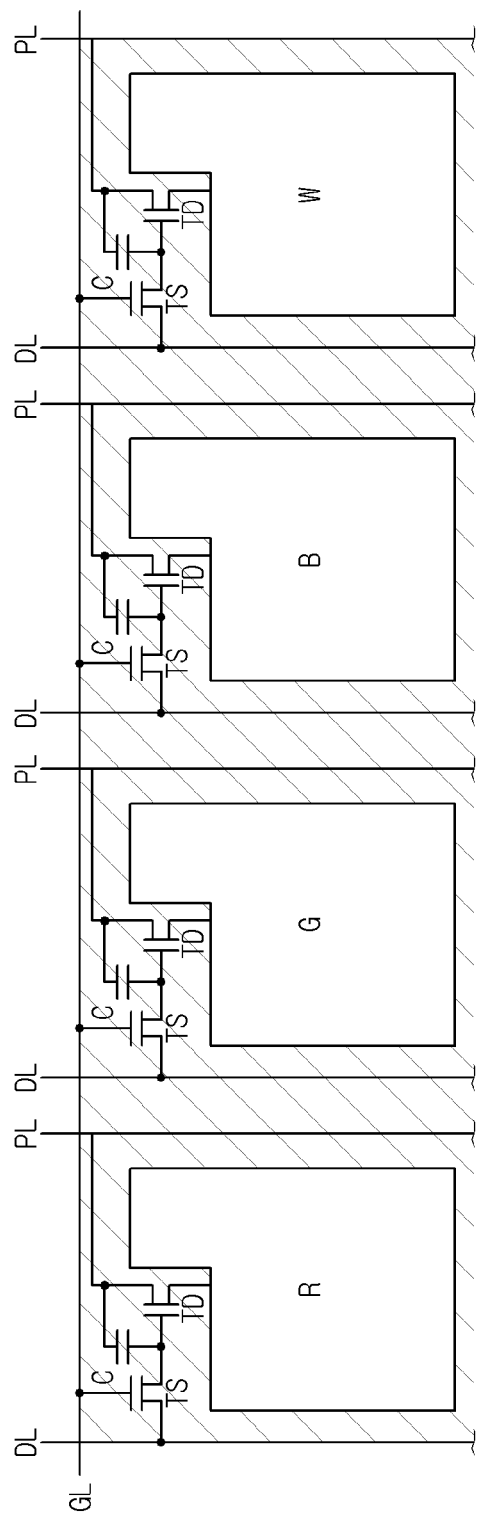

FIGS. 4A and 4B are planar views showing a formation region of a light absorption layer of an organic electroluminescence device according to an embodiment of the present disclosure.

Referring to FIG. 4A, the light absorption layer 136 (shown in FIG. 2A) of the organic electroluminescence device of the according to an embodiment of the present disclosure may be locally formed only over the thin film transistors.

Alternatively, the light absorption layer 136 (shown in FIG. 2A) of the organic electroluminescence device may be formed in the entire area with exception of openings, as shown in FIG. 4B.

More specifically, the organic electroluminescence device according to an embodiment of the present disclosure includes the red, green and blue pixel regions. The red, green and blue pixel regions are defined by crossing gate lines GL, data lines DL and power lines PL.

A switching thin film transistor TS, a driving thin film transistor TD connected to the switching thin film transistor TS, the first electrode 142 (shown in FIG. 2A) or other, and a storage capacitor C are formed in each of the red green and blue pixel regions.

The switching thin film transistor TS includes a gate electrode connected to one of gate lines GL, a source electrode connected to one of the data lines DL, and a drain electrode connected to a gate electrode 122 (shown in FIG. 2B) of the driving thin film transistor TD and the storage capacitor C. The driving thin film transistor TD includes the gate electrode 122 connected to the drain electrode of the switching thin film transistor TS and the storage capacitor C, a source electrode 124a (shown in FIG. 2B) connected to one of the power lines PL, and a drain electrode 124b (shown in FIG. 2B) connected to the first electrode 142 (shown in FIG. 2A).

The switching thin film transistor TS is turned-on and transfers a data signal on the respective the data line DL to the storage capacitor C and the gate electrode 122 (shown in FIG. 2B) of the driving thin film transistor TD, when a scan pulse is applied to the respective gate line GL. The driving thin film transistor TD replies to the data signal applied to its gate electrode 122 (shown in FIG. 2B) and controls a current I flowing from the respective power line PL toward an organic electroluminescence element (not shown). In accordance therewith, a light quantity emitted from the organic electroluminescence element is adjusted.

The light absorption layer 136 (shown in FIG. 2A) is formed not only over the driving thin film transistor TD but also over the switching thin film transistor TS. As described above, the light absorption layer 136 can be locally formed only over the thin film transistors. Alternatively, the light absorption layer 136 can be formed on the entire area with exception of the openings.

Figure 5:
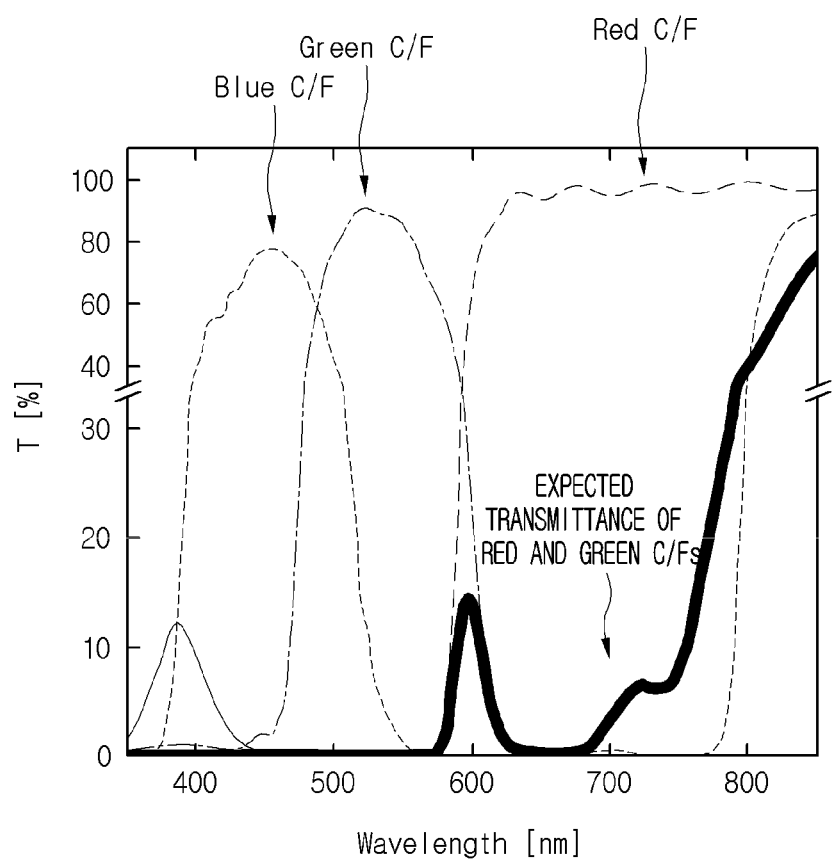
FIG. 5 is a data sheet illustrating expected transmittance of a light absorption layer of an organic electroluminescence device according to an embodiment of the present disclosure with respect to wavelength.

FIG. 5 is a data sheet illustrating expected transmittance of a light absorption layer of the organic electroluminescence device according to an embodiment of the present disclosure with respect to wavelength. In detail, FIG. 5 is a graphic diagram showing expected transmittance with respect to wavelength when the light absorption layer 136 (shown in FIG. 2A) is formed in the double layer structure of the red and green color filters.

As seen from FIG. 5, it is evident that the light absorption layer 136 (shown in FIG. 2A) formed in the double layer structure of the red and green color filters 131 and 132 (shown in FIG. 2A) almost completely absorbs light with wavelength of below 600 nm. As such, the IGZO semiconductor layer with mobility of 30 cm2/Vs can be almost completely protected from deterioration which is caused by light.

Figure 6:
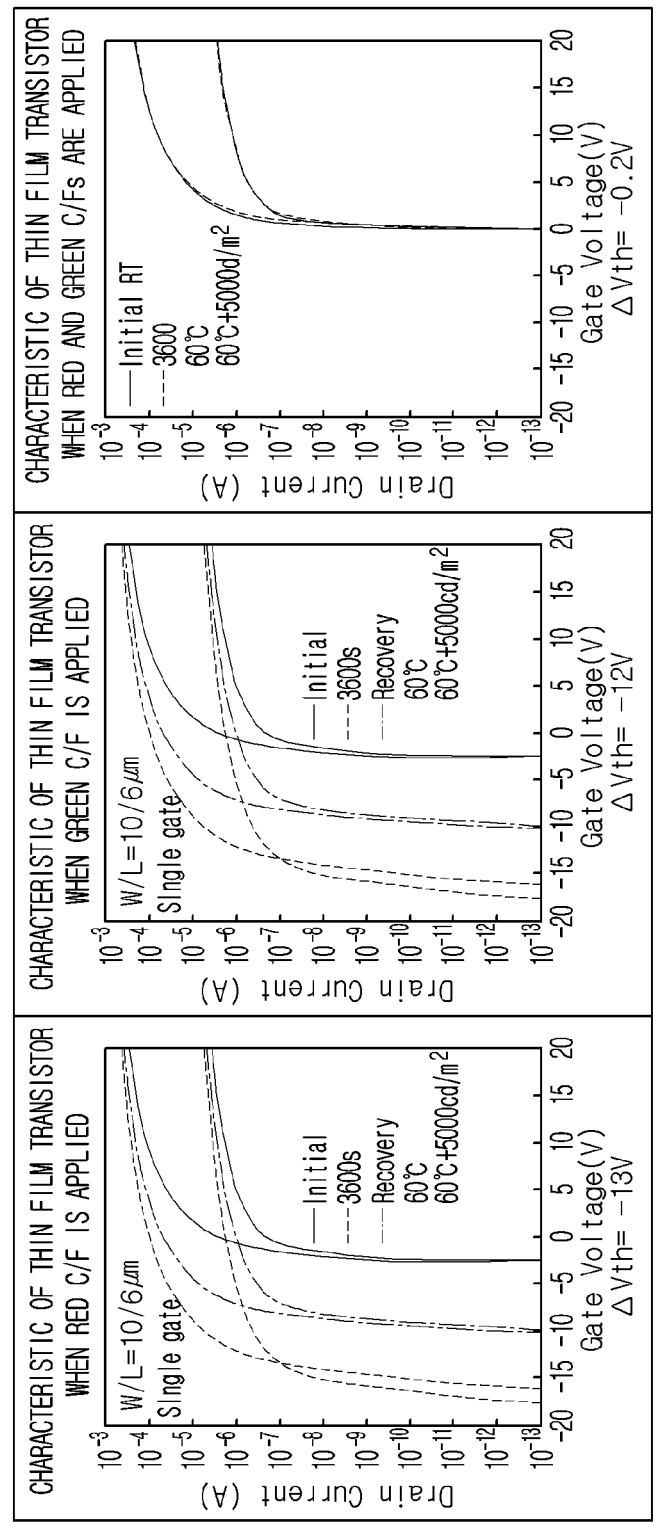
FIG. 6 is a data sheet comparing characteristics of a thin film transistor when light absorption layers different from one another are applied to the organic electroluminescence device according to an embodiment of the present disclosure.

FIG. 6 is a data sheet comparing characteristics of a thin film transistor when light absorption layers different from one another are applied to an organic electroluminescence device according to an embodiment of the present disclosure. In detail, a first graphic diagram illustrates a characteristic of the thin film transistor when a light absorption layer including only a red color filter is applied. A second graphic diagram illustrates another characteristic of the thin film transistor when a light absorption layer including only a green color filter is applied. A third graphic diagram illustrates still another characteristic of the thin film transistor when the light absorption layer 136 (shown in FIG. 2A) formed in the double layer structure of the red and green color filters 131 and 132 (shown in FIG. 2A) according to an according to an embodiment of the present disclosure is applied.

As seen from FIG. 6, it is evident that the light absorption layer 136 (shown in FIG. 2A) formed in the double layer structure of the red and green color filters 131 and 132 (shown in FIG. 2A) according to an embodiment of the present disclosure largely enhances a characteristic of the thin film transistor, compared to other light absorption layers including only one of the red and green color filters. In detail, when the light absorption layer 136 (shown in FIG. 2A) formed in the double layer structure of the red and green color filters 131 and 132 (shown in FIG. 2A) according to an embodiment of the present disclosure is applied, the threshold voltage Vth of the thin film transistor decreases by 0.2V (i.e., ΔVth=−0.2V). Meanwhile, the threshold voltage Vth of the thin film transistor decreases by 13V (i.e., ΔVth=−13V) when the light absorption layer including only the red color filter is applied. Also, the threshold voltage Vth of the thin film transistor decreases by 12V (i.e., ΔVth=−12V) when the light absorption layer including only the green color filter is applied. In other words, it is evident that the thin film transistor deteriorates when the light absorption layer including only one of the red and green color filters is applied.

FIGS. 7A through 7F are cross-sectional views illustrating a method of fabricating an organic electroluminescence device according to an embodiment of the present disclosure.

Figure 7A:
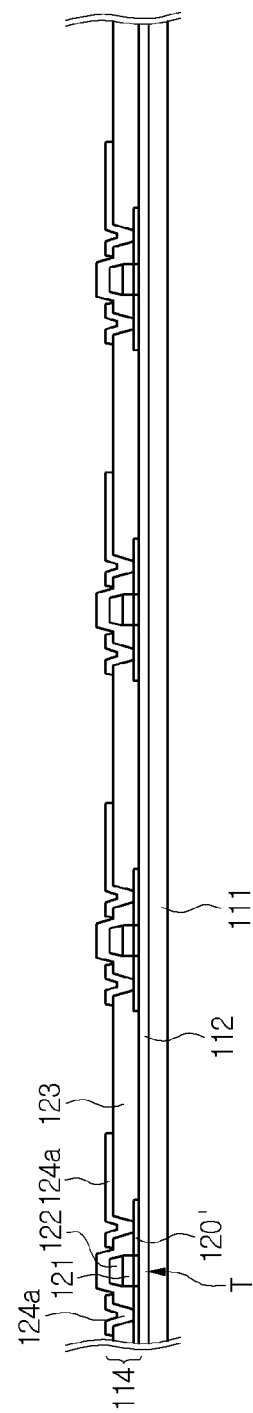

Referring to FIG. 7A, the method of fabricating an organic electroluminescence device according to an embodiment of the present disclosure allows a thin film transistor array 114 including driving thin film transistors T to be firstly formed on a substrate 111.

In order to form the driving thin film transistors T, a buffer layer 112 is firstly formed on the entire surface of the substrate 111 and active layers 120' are formed on the buffer layer 112. The active layers 120' are formed from an oxide with a high mobility. Also, the active layers 120' can be formed using one of a vapor deposition method and a photolithography method. For example, the active layers 120' are prepared by forming an oxide film of IGZO or others using the vapor deposition method and patterning the oxide film. The formation of a film is performed in order to form a polycrystalline oxide semiconductor sintered compound which is formed from IGZO or others. One of a sputtering method and a pulse laser deposition (PLD) method can be used in the formation of the film. Preferably, the sputtering method is used for mass production.

The process of patterning the oxide film can be performed by forming photoresist patterns on the oxide film of IGZO or others corresponding to portions, which the active layers 120' will be formed, and then etching the oxide film using an acid solution such as an mixed liquid of hydrochloric acid, nitric acid and dilute sulfuric acid, another mixed liquid of phosphoric acid, nitric acid and acetic acid, or others. The aqueous solution including phosphoric acid, nitric acid and acetic acid can remove exposed portion of an IGZO film during a short time.

A gate insulation film 121 and a gate electrode 122 are sequentially formed in the central region of each active layer 120'. Subsequently, a first insulation layer 123 and source and drain electrodes 124a and 124b are sequentially formed, thereby completing the driving thin film transistor T.

As shown in FIG. 7B, a second insulation layer 130 is formed on the entire surface of the substrate 111 provided with the source and drain electrodes 124a and 124b of the driving thin film transistors T. The second insulation layer 130 can be prepared by coating an insulation material on the entire surface of the substrate 111. As an example of the insulation material, one of an organic insulation material and an inorganic insulation material can be used. The organic insulation material can become an acryl based organic compound or others. The inorganic insulation material can become silicon oxide SiOx, silicon nitride SiNx or others.

Also, red, green and blue color filters 131, 132 and 133 are formed on the second insulation layer 130 corresponding to respective pixel regions, respectively. At the same time, a light absorption layer 136 is also formed in a stacked structure of the red and green color filters 131 and 132.

The light absorption layer 136 is formed over not only the driving thin film transistors T but also switching thin film transistors even though it not shown in the drawings. The formation range of the light absorption layer 136 can be limited to the upper portions of the thin film transistors, but can be expanded into the entire area with exception of openings.

The procedure of forming the red, green and blue color filters 131, 132 and 133 and the light absorption layer 136 will now be described in detail. First, the red color filter 131 is formed on the second insulation layer 130 corresponding to the red pixel region and the thin film transistors by coating a red color resist including a red dye on the second insulation layer 130 and patterning the red color resist through a photolithography procedure and an etching process. The green color filter 132 is formed on the second insulation layer 130 corresponding the green pixel region and on the red color filter 131 which is disposed over the thin film transistors, by coating a green color resist including a green dye on the second insulation layer 130 provided with the red color filter 131 and patterning the green color resist through another photolithography procedure and another etching process. The blue color filter 133 is formed on the second insulation layer 130 corresponding to the blue pixel region, by coating a blue color resist including a blue dye on the insulation layer 130 provided with the red and green color filters 131 and 132 and patterning the blue color resist through still another photolithography procedure and still another etching process.

In this way, the red, green and blue color filters 131, 132 and 133 are formed in the red, green and blue pixel regions, respectively, and the light absorption layer 136 including the stacked red and green color filters 131 and 132 are formed over the thin film transistors. Although it is explained that the light absorption layer 136 is formed in a double layer structure of the red and green color filters 131 and 132, the light absorption layer 136 can be formed in a triple layer structure of the red, green and blue color filters 131, 132 and 133. In the stacking order of the color filters, it is explained herein that the red color filter 131 is first formed, but the green color filter 132 can be first formed. However, the stacking order of the color filters is preferably set in consideration of the degree of deterioration caused by a developer.

Figure 7C:
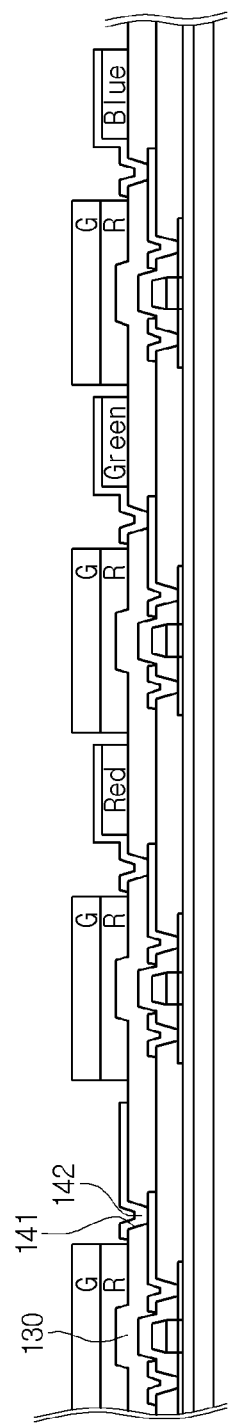

Referring to FIG. 7C, drain contact holes 141 are formed in the second insulation layer provided with the red, green and blue color filters 131, 132 and 133 and the light absorption layer 136. Also, first electrodes 142 are formed on the second insulation layer 130 provided with the drain contact holes 141. Each of the first electrodes 142 is connected to the respective drain electrode 124b through the respective drain contact hole 141. The first electrodes 142 are formed by depositing a transparent conductive material on the entire surface of the second insulation layer 130 provided with the drain contact holes 141 and patterning the deposited transparent conductive material through a photolithography procedure and an etching process.

Figure 7D:
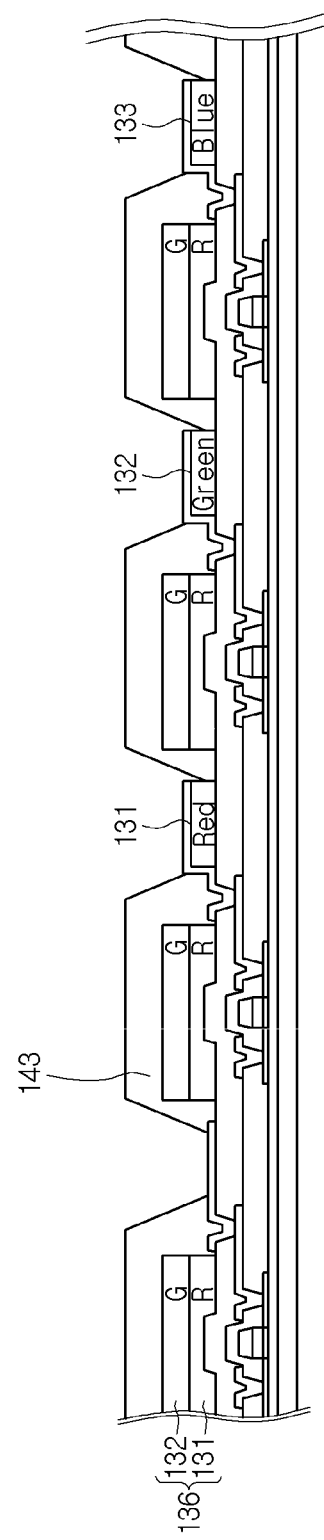

As shown in FIG. 7D, a passivation layer 143 is formed by depositing an insulation material on the entire surface of the substrate 111. The passivation layer 143 is partially removed through a photolithography procedure and an etching process and partially exposes each of the first electrodes 142. Such a passivation layer 143 is used to protect the thin film transistors from moisture and alien substances.

Referring to FIG. 7E, an organic light emission layer 144 and a second electrode 145 are sequentially formed on the partially exposed first electrodes 142.

Figure 7F:
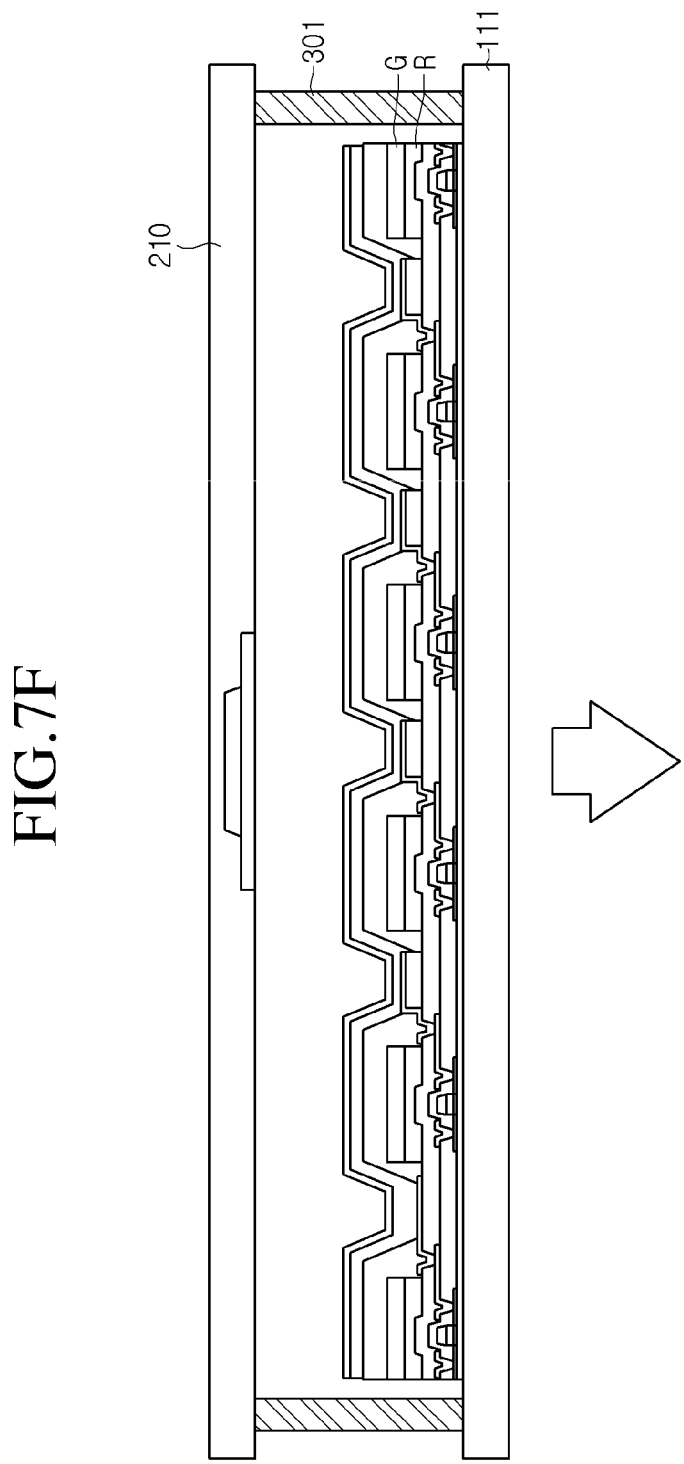

Referring to FIG. 7F, the first substrate, 111 which is provided with the second electrode 145 and faces a second substrate 211, is combined with the second substrate 211 by means of a sealant 301. In accordance therewith, the organic electroluminescence device according to an embodiment of the present disclosure is completed.

As described above, the present disclosure can allow the light absorption layers to be disposed over and under the thin film transistor. In accordance therewith, the deterioration of the thin film transistor caused by light can be prevented. As a result, the organic electroluminescence device can enhance reliability against light.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the detailed description.

What is claimed is:

1. An organic electroluminescence device comprising:
a substrate having a plurality of pixel regions;
a display element on the substrate in each of the pixel regions, the display element comprising:
a thin film transistor on the substrate, the thin film transistor having a source electrode and a drain electrode;
an insulation layer covering the thin film transistor;
a first electrode connected to the thin film transistor through a contact hole in the insulation layer;
an organic light emission layer formed on the first electrode;
a second electrode formed on the organic light emission layer;
a first light absorption layer formed directly on top of the insulation layer in between the thin film transistor and the organic light emission layer, the first light absorption layer configured to shield the thin film transistor from light emitted from the organic light emission layer; and
a passivation layer formed directly on top of the first light absorption layer and at least a portion of the first electrode and formed directly below the organic light emission layer.

2. The organic electroluminescence device of claim 1, wherein the thin film transistor includes a semiconductor layer formed from an oxide.

3. The organic electroluminescence device of claim 2, wherein the oxide is a compound represented by the following chemical formula 1:

$$A_w B_x C_y O_z$$ [Chemical formula 1]

wherein 1, "A", "B" and "C" are one of indium In, gallium Ga, zinc Zn, aluminum Al and tin Sn, respectively, and "w", "x", "y" and "z" are natural numbers of not less than 1 but no more than 10.

4. The organic electroluminescence device of claim 1, further comprising a second light absorption layer formed under the thin film transistor and configured to shield the thin film transistor from external light.

5. The organic electroluminescence device of claim 1, further comprising a second light absorption layer formed on the first light absorption layer under the organic light emission layer.

6. The organic electroluminescence device of claim 1, wherein the first light absorption layer is formed from an organic material or a non-conductive inorganic material, the non-conductive inorganic material having a band gap energy of at most 2 eV.

7. The organic electroluminescence device of claim 6, wherein the non-conductive inorganic material is one of germanium Ge, copper oxide CuO and gallium arsenide GaAs.

8. The organic electroluminescence device of claim 6, wherein the organic material includes at least two color filters selected from a group which consists of red, green and blue color filters.

9. The organic electroluminescence device of claim 1, wherein the thin film transistor is one of a coplanar structure, an inverted coplanar structure, and an etch stopper structure.

10. An organic electroluminescence device comprising:
a substrate having an active area divided into a plurality of pixel regions;
a transistor array on the substrate including a plurality of thin film transistors in each of the pixel regions, each of the plurality of thin film transistors having a source electrode and a drain electrode;
an insulation layer covering the plurality of thin film transistors;
an organic light emitting diode array including a plurality of organic light emitting diodes in each of the pixel regions, each organic light emitting diode of the organic light emitting diode array having a first electrode coupled to a corresponding thin film transistor of the transistor array through a corresponding contact hole in the insulation layer, an organic light emission layer, and a second electrode;
a plurality of first light absorption layers disposed directly on top of the insulation layer in between a corresponding thin film transistor in the transistor array and a corresponding organic light emitting diode in the organic light emitting diode array; and
a passivation layer formed directly on top of the plurality of first light absorption layers and at least a portion of the first electrodes of the organic light emitting diode array, the passivation layer formed directly below the organic light emission layers of the organic light emitting diode array.

11. The organic electroluminescence device of claim 10, wherein the first light absorption layer is fabricated from a material that selectively absorbs light having a wavelength of less than 450 nanometers.

12. The organic electroluminescence device of claim 10, wherein the first light absorption layer is formed from a material having a band gap energy of at most 2 ev, the material being one of an organic material or a non-conductive inorganic material.

13. The organic electroluminescence device of claim 10, wherein the first light absorption layer is formed from one of a non-conductive inorganic material of silicon, germanium, copper oxide, and gallium arsenide.

14. The organic electroluminescence device of claim 10, wherein the first light absorption layer is an organic material that includes at least two color filters selected from a group consisting of red, green and blue color filters.

15. The organic electroluminescence device of claim 10, further comprising a second light absorption layer formed under the thin film transistor array configured to shield the plurality of thin film transistors from external light.

16. The organic electroluminescence device of claim 10, further comprising a second light absorption layer formed on the first light absorption layer under an organic light emission layer of the organic light emitting diode array.

* * * * *